United States Patent
Kim et al.

(10) Patent No.: US 8,034,460 B2
(45) Date of Patent: *Oct. 11, 2011

(54) METALLIC LAMINATE AND METHOD OF MANUFACTURING THE SAME

(75) Inventors: Byung Nam Kim, Seoul (KR); Joo Eun Ko, Daejeon Metropolitan (KR); Heon Sik Song, Daejeon Metropolitan (KR); Byeong In Ahn, Daejeon Metropolitan (KR)

(73) Assignee: LG Chem, Ltd., Seoul (KR)

( * ) Notice: Subject to any disclaimer, the term of this patent is extended or adjusted under 35 U.S.C. 154(b) by 191 days.

This patent is subject to a terminal disclaimer.

(21) Appl. No.: 11/487,981

(22) Filed: Jul. 18, 2006

(65) Prior Publication Data

US 2007/0023874 A1 Feb. 1, 2007

(30) Foreign Application Priority Data

Jul. 27, 2005 (KR) ........................ 10-2005-0068407

(51) Int. Cl.
*B32B 15/08* (2006.01)

(52) U.S. Cl. ..... 428/458; 428/215; 428/216; 428/473.5; 174/258; 174/259

(58) Field of Classification Search .................. 428/209, 428/458, 473.5, 215, 216; 174/258–259
See application file for complete search history.

(56) References Cited

U.S. PATENT DOCUMENTS

| 5,234,522 | A |   | 8/1993  | Suzuki et al. |         |
|-----------|---|---|---------|---------------------|---------|
| 5,262,227 | A | * | 11/1993 | Takabayashi et al. | 428/215 |
| 5,300,364 | A |   | 4/1994  | Hase et al.         |         |
| 6,335,416 | B1|   | 1/2002  | Nojiri et al.       |         |
| 6,379,784 | B1| * | 4/2002  | Yamamoto et al.    | 428/216 |

FOREIGN PATENT DOCUMENTS

JP          05-214301          8/1993

* cited by examiner

*Primary Examiner* — Cathy Lam
(74) *Attorney, Agent, or Firm* — McKenna Long & Aldridge LLP

(57) ABSTRACT

Disclosed herein are a metallic laminate, including (i) a metal layer and (ii) a polyimide resin layer having a coefficient of thermal expansion of 19 ppm/° C. or less and a glass transition temperature of 350° C. or more, laminated on the metal layer, and a method of manufacturing the same. According to this invention, the metallic laminate has a good external appearance, having no foam on the polyimide resin layer.

5 Claims, No Drawings

METALLIC LAMINATE AND METHOD OF MANUFACTURING THE SAME

TECHNICAL FIELD

The present invention relates to a metallic laminate comprising a metal layer and a resin layer laminated thereon. More particularly, the present invention relates to a metallic laminate for a printed circuit board, comprising a metal layer and a resin layer laminated thereon, in which the formation of foam is prevented upon curing of the resin layer.

This application claims the benefit of the filing date of Korean Patent Application Nos. 10-2005-0068407, filed on Jul. 27, 2005, with the Korean Intellectual Property Office, the disclosure of which is incorporated herein in its entirety by reference.

BACKGROUND ART

According to the trends toward miniaturization, multifunctionality, and decreased weight and thickness of electronic devices, a circuit substrate for use in electronic devices is required to be highly densely patterned. To this end, methods of fabricating a multilayered circuit substrate have been employed. In addition, flexible printed circuit base boards, which have flexibility such that a circuit substrate can be mounted in a narrow space, and also circuits having narrow line widths to obtain greater numbers of circuits in the same space have been used.

The typical soldering process applied to the fabrication of the multilayered circuit substrate entails environmental problems. Therefore, the fabrication of the multilayered circuit substrate requires the use of an adhesive having good adhesion, high heat resistance, and a low hygroscopic rate. However, a metallic laminate, obtained by attaching a polyimide film to a metal foil using a conventional acrylic or epoxy adhesive, is unsuitable for use in a circuit substrate requiring a multilayered structure, flexibility, good adhesion, and high heat resistance. Hence, a 2-layer copper clad laminate (2CCL) type flexible metallic laminate, resulting from direct attachment of polyimide and a metal foil without the use of an adhesive, has been developed. As such, since the metallic laminate thus obtained is advantageous because it has thermal stability, durability, and electrical properties superior to those of 3CCL (3-layer Copper Clad Laminate), comprising a metal layer and a polyimide film attached thereto using a conventional adhesive, it is thus suitable for use in a flexible circuit substrate.

Further, in order to realize a highly dense printed circuit board, the line width thereof should be further decreased. Accordingly, in the 2CCL type metallic laminate, the metal layer is formed to be thinner and the polyimide layer is formed to be thicker so as to have good processibility and insulation properties.

However, in the case where the polyimide layer is formed to a predetermined thickness or greater, a lot of foam may be undesirably formed on the surface of the polyimide layer when curing the polyimide layer on the metal layer.

DISCLOSURE

Technical Problem

Leading to the present invention, intensive and thorough research on metallic laminates, carried out by the present inventors aiming to avoid the problems encountered in the related art, resulted in the finding that, in a metallic laminate having a metal layer and a resin layer laminated thereon, when the resin layer is formed of polyimide resin having a coefficient of thermal expansion of 19 ppm/° C. or less and a glass transition temperature (Tg) of 350° C. or more, the formation of foam on the surface of the resin layer is prevented when the resin layer is cured.

Therefore, an object of the present invention is to provide a metallic laminate comprising a metal layer and a resin layer laminated thereon, in which the formation of foam on the surface of the resin layer is prevented, and a method of manufacturing such a metallic laminate.

Technical Solution

Accordingly, the present invention provides a metallic laminate, comprising (i) a metal layer and (ii) a polyimide resin layer having a coefficient of thermal expansion of 19 ppm/° C. or less and a Tg of 350° C. or more, laminated on the metal layer.

In addition, the present invention provides a method of manufacturing a metallic laminate, comprising coating a precursor solution of polyimide resin, having a coefficient of thermal expansion of 19 ppm/° C. or less and a Tg of 350° C. or more, on a metal layer, and then drying and curing it.

BEST MODE

Hereinafter, a detailed description of the present invention will be given.

In the present invention, the term "polyimide resin", the general name given to resin having an imide ring structure, includes, for example, polyimides, polyamideimides, polyesterimides, etc. Further, the coefficient of thermal expansion thereof is obtained by calculating the average coefficient of linear expansion from 100° C. to 200° C. while heating a sample subjected to sufficient imidation at a rate of 10° C./min using a thermomechanical analyzer (TMA).

As the polyimide resin layer which is formed on the metal layer, a polyimide resin layer having a coefficient of thermal expansion of 19 ppm/° C. or less and a Tg of 350° C. or more is provided, thereby preventing the formation of foam on the surface of the resin layer when cured, leading to a metallic laminate having a good external appearance. In the present invention, when the polyimide resin layer is formed in a thickness range of 30~50 μm, the formation of foam on the surface of the resin layer can be prevented. However, the present invention is not limited to the above thickness range of the resin layer. In the present invention, although the minimum coefficient of thermal expansion of the polyimide resin layer is not particularly limited, the coefficient of thermal expansion of the resin layer is preferably 5 ppm/° C. or more. Further, the maximum Tg of the polyimide resin layer is not particularly limited, but the polyimide resin layer preferably has the Tg of 450° C. or less.

In addition, with the goal of improving dimensional stability against temperature change, adhesion, flatness before and after etching, and chemical resistance of the metallic laminate, the polyimide resin layer of the metallic laminate may be provided in the form of a multilayered structure having different coefficients of thermal expansion.

For example, when a polyimide resin layer having a coefficient of thermal expansion of 19 ppm/° C. or less and a Tg of 350° C. or more is set to a first low thermal expansion polyimide resin layer, a second low thermal expansion polyimide resin layer having a coefficient of thermal expansion of 19 ppm/° C. or less may be formed on the first low thermal expansion polyimide resin layer. As such, one of the first low thermal expansion polyimide resin layer and the second low thermal expansion polyimide resin layer may have a coefficient of thermal expansion of 5~15 ppm/° C., the other may have a coefficient of thermal expansion of 15~19 ppm/° C., the difference between the coefficients of thermal expansion of the first and second low thermal expansion polyimide resin layers being preferably 3 ppm/° C. or more.

Further, on the low thermal expansion polyimide resin layer, a high thermal expansion polyimide resin layer having a coefficient of thermal expansion exceeding 19 ppm/° C. may be provided. In such a case, it is preferred that the difference between the coefficients of thermal expansion of the high thermal expansion polyimide resin and the low thermal expansion polyimide resin be 10 ppm/° C. or more.

Preferably, the high thermal expansion polyimide resin has a coefficient of thermal expansion more than 19 ppm/° C. but not more than 60 ppm/° C.

In the present invention, even though the polyimide resin layers have the same composition, they may be formed in a multilayered structure by repeatedly conducting a series of procedures of coating and drying the resin layers and then curing a bundle of such resin layers.

Moreover, the coefficient of thermal expansion and the Tg of the polyimide resin layer may be controlled by changing the type and composition of dianhydride and diamine in a polyimide precursor solution, which is known to those skilled in the art.

In the present invention, the polyimide resin layer may be obtained by adding a mixture of dianhydride and diamine to an organic solvent to prepare a polyimide precursor solution, which is then coated once or more on the metal layer, dried, and cured.

The dianhyride and diamine is preferably mixed at a molar ratio of 1:0.9~1:1.1.

As such, the dianhydride may comprise at least one selected from the group consisting of PMDA (pyromellitic dianhydride), BPDA (3,3',4,4'-biphenyltetracarboxylic dianhydride), BTDA (3,3', 4,4'-benzophenone tetracarboxylic dianhydride), ODPA (4,4'-oxydiphthalic anhydride), BPADA (4,4'-(4,4'-isopropylbiphenoxy)biphthalic anhydride), 6FDA (2,2'-bis-(3,4-dicarboxylphenyl)hexafluoropropane dianhydride), and TMEG (ethyleneglycol bis(anhydro-trimellitate)), but the present invention is not limited thereto.

In addition, the diamine may comprise at least one selected from the group consisting of p-PDA (p-phenylenediamine), m-PDA (m-phenylenediamine), 4,4'-ODA (4,4'-oxydianiline), 3,4'-ODA (3,4'-oxydianiline), TPE-R (1,3-bis(4-aminophenoxy)benzene), BAPP (2,2-bis(4-[4-aminophenoxy]-phenyl)propane), HAB (3,3'-dihydroxy-4,4'-diaminobiphenyl), and DABA (4,4'-diaminobenzanilide) but the present invention is not limited thereto.

Further, in the present invention, another dianhydride and diamine, in addition to the above-mentioned compounds, may be added in a small amount to the precursor solution for the formation of the polyimide resin layer, if necessary. In order to easily apply or cure the polyimide precursor solution or to improve the other properties, an additive, such as an antifoaming agent, an antigelling agent, a curing accelerator, etc., may be used.

Examples of the organic solvent suitable for use in the preparation of the polyimide precursor solution include, but are not limited to, N-methylpyrrolidone (NMP), N,N-dimethylacetamide (DMAc), tetrahydrofuran (THF), N,N-dimethylformamide (DMF), dimethylsulfoxide (DMSO), cyclohexane, acetonitrile, and mixtures thereof.

The polyimide precursor is preferably contained in the polyimide precursor solution in an amount of 10~30 wt %. If the amount of the precursor is less than 10 wt %, excess solvent should be used. On the other hand, if the amount exceeds 30 wt %, it is impossible to apply the solution uniformly, because the viscosity thereof is too high.

The polyimide precursor solution may be applied on the metal layer using a coating process typically known in the art, for example, die coating, comma coating, reverse comma coating, gravure coating, etc. The subsequent drying of the polyimide precursor solution, which is coated on the metal layer, may vary with the type of oven and drying conditions. In particular, the polyimide precursor solution may be dried at 50~350° C., and preferably at 80~250° C., which is lower than the boiling point of the solvent.

After the polyimide precursor solution is coated and dried on the metal layer, the temperature is increased to 350° C. and thus the precursor solution is cured. The curing process may be conducted using an oven in a nitrogen atmosphere or in a vacuum while the temperature is slowly increased, or may be conducted using continuous passes through a high temperature zone in a nitrogen atmosphere.

Also, the metal layer may be formed of copper, aluminum, iron, silver, palladium, nickel, chromium, molybdenum, tungsten, or alloys thereof. Of these metals, copper is most preferable.

Further, the present invention may provide a double-sided metallic laminate.

In this way, according to the present invention, a 2-layer metallic laminate for use in a flexible printed circuit board can be fabricated, without generating foam on the surface of the polyimide resin layer.

Mode for Invention

A better understanding of the present invention may be obtained through the following examples which are set forth to illustrate, but are not to be construed as the limit of the present invention.

EXAMPLE

Below, the coefficient of thermal expansion, Tg, whether or not foam is formed, and flatness before etching were observed.

1. Checking for Formation of Foam on Polyimide and Measurement of Flatness Before Etching A copper clad laminate including a polyimide resin layer was cut to 25 cm×25 cm and then set on a flat place, after which the heights of corners thereof were determined and averaged. If the average value did not exceed 0.5 cm, flatness before etching was evaluated as good. Further, a copper clad laminate including polyimide was cut to 25 cm×25 cm as mentioned above. When the amount of foam existing on the laminate thus cut was 0, foam was deemed not to have formed.

2. Measurement of Coefficient of Thermal Expansion of Polyimide Film

The coefficient of thermal expansion thereof was obtained by calculating the average coefficient of linear expansion from 100° C. to 200° C. while heating a sample subjected to sufficient imidation at a rate of 10° C./min using a TMA.

3. Measurement of Tg of Polyimide Film

A copper clad laminate including a polyimide resin layer was etched and then cut to 0.5 cm×5 cm, after which this film was heated up to 400° C. at a rate of 5° C./min using DMA (Dynamic Mechanical Analyzer for Thermal Analysis). The Tg of the film was defined as a temperature when tan δ is highest.

Preparation of Polyimide Resin Layer

Synthesis Example 1

1.89 g of p-PDA and 5.25 g of 4,4'-ODA were dissolved in 162 ml of N-methylpyrrolidinone, and 12.78 g of BPDA was added thereto, after which the reaction mixture was stirred for 24 hours and polymerized. Such polymerization was conducted at 5° C. The polymerized solution was heated to 350° C., thus preparing a film 40 μm thickness. This film was heated at a rate of 10° C./min and the coefficient of linear expansion thereof was measured using a TMA. As the result, the average coefficient of linear expansion was measured to be 31 ppm/° C. in the range from 100° C. to 200° C., and the Tg to be 312° C.

Synthesis Examples 2 to 11

A polyimide resin layer was prepared in the same manner as in Synthesis Example 1 using dianhydride and diamine shown in Table 1 below. The coefficient of thermal expansion and the Tg of the polyimide resin layer of each of Synthesis Examples 2 to 11 were measured. The results are shown in Table 1 below.

TABLE 1

| No. | Dianhydride(g) | | | Diamine(g) | | coefficient of thermal | Tg (° C.) |
|---|---|---|---|---|---|---|---|
| Syn. Ex. 1 | BPDA 12.78 | — | — | p-PDA 1.89 | 4,4'-ODA 5.25 | 31 | 312 |
| Syn. Ex. 2 | BPDA 11.84 | PMDA 1.10 | BTDA 1.62 | p-PDA 5.44 | — | 10 | 376 |
| Syn. Ex. 3 | BPDA 1.41 | PMDA 1.05 | BTDA 12.34 | p-PDA 5.18 | — | 27 | 384 |
| Syn. Ex. 4 | BPDA 6.50 | PMDA 1.07 | BTDA 7.12 | p-PDA 5.31 | — | 18 | 364 |
| Syn. Ex. 5 | BPDA 6.10 | PMDA 7.10 | — | p-PDA 4.50 | 4,4'-ODA 2.30 | 16.5 | 356 |
| Syn. Ex. 6 | BPDA 6.50 | — | BTDA 7.10 | p-PDA 3.30 | DABA 3.00 | 18 | 332 |
| Syn. Ex. 7 | BPDA 5.79 | — | BTDA 6.34 | — | 4,4'-ODA 7.88 | 51 | 312 |
| Syn. Ex. 8 | BPDA 1.75 | — | BTDA 10.86 | p-PDA 0.64 | 4,4'-ODA 6.75 | 50 | 322 |
| Syn. Ex. 9 | BPDA 13.12 | — | — | p-PDA 2.41 | 4,4'-ODA 4.47 | 31 | 331 |
| Syn. Ex. 10 | — | PMDA 9.50 | BTDA 3.50 | p-PDA 4.70 | HAB 2.30 | 8 | 362 |

Example 1

A first polyimide precursor solution having the composition used in Synthesis Example 2 was applied on a copper foil to have a cured thickness as shown in Table 2 below, and then dried at 140° C. Subsequently, on the first polyimide precursor layer thus formed, a second polyimide precursor solution having the composition used in Synthesis Example 1 was applied, dried, and then cured at 350° C. No foam was observed to have formed on polyimide.

Examples 2 to 7

A copper clad laminate was manufactured in the same manner as in Example 1 using the polyimide precursor solution shown in Table 2 below, followed by observing the polyimide layer for whether to foam formed on polyimide and for curl properties before etching. As shown in Table 2 below, there was no foam on the surface of the polyimide layer, and no curl before etching thereon.

Comparative Example 1

A first polyimide precursor solution having the composition used in Synthesis Example 1 was applied on a copper foil to have a cured thickness of 10 μm, and then dried at 140° C. Subsequently, on the first polyimide precursor layer thus formed, a second polyimide precursor solution having the composition used in Synthesis Example 2 was applied to have a cured thickness of 30 μm, dried, and then cured at 350° C. As a result, foam existed on the surface of the cured polyimide layer, and severe curl toward the copper foil occurred before etching.

Comparative Example 2

A first polyimide precursor solution having the composition used in Synthesis Example 8 was applied on a copper foil to have a cured thickness of 10 μm, and then dried at 140° C. Subsequently, on the first polyimide precursor layer thus formed, a second polyimide precursor solution having the composition used in Synthesis Example 2 was applied to have a cured thickness of 30 μm, dried, and then cured at 350° C. As a result, foam was found to exist on the surface of the cured polyimide layer, and severe curl toward the copper foil occurred before etching.

Comparative Example 3

A first polyimide precursor solution having the composition used in Synthesis Example 7 was applied on a copper foil to have a cured thickness of 10 μm, and then dried at 140° C. Subsequently, on the first polyimide precursor layer thus formed, a second polyimide precursor solution having the composition used in Synthesis Example 8 was applied to have a cured thickness of 30 μm, dried, and then cured at 350° C. As a result, foam was found to exist on the surface of the cured polyimide layer, and severe curl toward the copper foil occurred before etching.

Comparative Example 4

A first polyimide precursor solution having the composition used in Synthesis Example 6 was applied on a copper foil to have a cured thickness of 32 μm, and then dried at 140° C. Subsequently, on the first polyimide precursor layer thus formed, a second polyimide precursor solution having the composition used in Synthesis Example 3 was applied to have a cured thickness of 8 μm, dried, and then cured at 350° C. As a result, foam was found to exist on the surface of the cured polyimide layer, and there was no curl before etching.

TABLE 2

| | 1st Layer | | | | 2nd Layer | | | | |
|---|---|---|---|---|---|---|---|---|---|
| No. | Precursor Solution | Thickness (μm) | coefficient of thermal expansion (ppm/° C.) | Tg (° C.) | Precursor Solution | Thickness (μm) | coefficient of thermal expansion (ppm/° C.) | Tg (° C.) | Foam |
| Ex. 1 | Syn. Ex. 2 | 30 | 10 | 376 | Syn. Ex. 1 | 10 | 31 | 312 | No |
| Ex. 2 | Syn. Ex. 2 | 32 | 10 | 376 | Syn. Ex. 3 | 8 | 27 | 384 | No |
| Ex. 3 | Syn. Ex. 5 | 18 | 16.5 | 356 | Syn. Ex. 3 | 12 | 27 | 384 | No |
| Ex. 4 | Syn. Ex. 5 | 37 | 16.5 | 356 | Syn. Ex. 7 | 3 | 51 | 312 | No |
| Ex. 5 | Syn. Ex. 2 | 32 | 10 | 376 | Syn. Ex. 9 | 8 | 31 | 331 | No |
| Ex. 6 | Syn. Ex. 10 | 35 | 8 | 362 | Syn. Ex. 8 | 15 | 50 | 322 | No |
| Ex. 7 | Syn. Ex. 10 | 25 | 8 | 362 | Syn. Ex. 9 | 25 | 31 | 331 | No |
| C. Ex. 1 | Syn. Ex. 1 | 10 | 31 | 312 | Syn. Ex. 2 | 30 | 10 | 376 | Yes |
| C. Ex. 2 | Syn. Ex. 8 | 10 | 50 | 322 | Syn. Ex. 2 | 30 | 10 | 376 | Yes |
| C. Ex. 3 | Syn. Ex. 7 | 10 | 51 | 312 | Syn. Ex. 8 | 30 | 50 | 322 | Yes |
| C. Ex. 4 | Syn. Ex. 6 | 32 | 18 | 332 | Syn. Ex. 3 | 8 | 27 | 384 | Yes |

INDUSTRIAL APPLICABILITY

As described hereinbefore, in the metallic laminate of the present invention, the coefficient of thermal expansion and Tg of a polyimide resin layer, which is provided on a metal layer, are controlled, thereby solving problems of foaming at the surface of the polyimide resin layer. Therefore, the metallic laminate of the present invention has a good external appearance and thus is suitable for use in printed circuit boards.

The invention claimed is:

1. A metallic laminate, comprising
   (i) a metal layer;
   (ii) a low thermal expansion polyimide resin layer directly coated on the metal layer and having a coefficient of thermal expansion of 19 ppm/° C. or less and a glass transition temperature of 350° C. or more; and
   (iii) a high thermal expansion polyimide resin layer coated on the low thermal expansion polyimide resin layer and having a coefficient of thermal expansion exceeding 19 ppm/° C.,
   wherein the sum of the thickness of the low thermal expansion polyimide resin layer and the thickness of the high thermal expansion polyimide resin layer is 30~50 μm.

2. The metallic laminate according to claim 1, wherein the metal layer is formed of material selected from the group consisting of copper, aluminum, iron, silver, palladium, nickel, chromium, molybdenum, tungsten, and alloys thereof.

3. The metallic laminate according to claim 1, wherein the low thermal expansion polyimide resin layer has a coefficient of thermal expansion of 5-19 ppm/° C. and a glass transition temperature of 350~450° C.

4. A printed circuit board comprising the metallic laminate of claim 1.

5. The metallic laminate according to claim 1, wherein the coated low thermal expansion polyimide resin layer is formed by applying a solution on the metal layer.

* * * * *